United States Patent [19]

Lopergolo et al.

[11] Patent Number: 5,800,184

[45] Date of Patent: Sep. 1, 1998

[54] HIGH DENSITY ELECTRICAL INTERCONNECT APPARATUS AND METHOD

[75] Inventors: Emanuele Frank Lopergolo, Marlboro; Lewis Sigmund Goldmann, Bedford; Joseph Michael Sullivan, Wappingers Falls; Charles Russell Tompkins, Jr., Poughkeepsie, all of N.Y.

[73] Assignee: International Business Machines Corporation, Armonk, N.Y.

[21] Appl. No.: 570,076

[22] Filed: Dec. 11, 1995

Related U.S. Application Data

[63] Continuation-in-part of Ser. No. 207,768, Mar. 8, 1994.

[51] Int. Cl.$^6$ .................................................. H01R 9/09
[52] U.S. Cl. .......................... 439/66; 439/591; 439/862
[58] Field of Search .......................... 29/593, 837, 840; 439/66, 591, 65, 91, 79, 862

[56] References Cited

U.S. PATENT DOCUMENTS

| | | | |
|---|---|---|---|
| 3,806,801 | 4/1974 | Bove | 324/72.5 |
| 4,027,935 | 6/1977 | Byrnes et al. | 439/65 |
| 4,161,346 | 7/1979 | Cherian et al. | 439/591 |
| 4,199,209 | 4/1980 | Cherian et al. | 439/591 |
| 4,295,700 | 10/1981 | Sado | 439/91 |
| 4,307,928 | 12/1981 | Petlock, Jr. | 439/824 |
| 4,506,215 | 3/1985 | Coughlin | 324/158 |
| 4,932,883 | 6/1990 | Hsia et al. | 439/66 |
| 4,963,822 | 10/1990 | Prokopp | 324/158 |
| 4,975,079 | 12/1990 | Beaman et al. | 439/482 |
| 4,992,053 | 2/1991 | Lindeman et al. | 439/66 |
| 5,000,690 | 3/1991 | Sonobe et al. | 439/76 |
| 5,137,456 | 8/1992 | Desai et al. | 439/66 |
| 5,157,325 | 10/1992 | Murphy | 324/158 |
| 5,163,834 | 11/1992 | Chapin et al. | 439/66 |
| 5,169,320 | 12/1992 | Burkett, Jr. et al. | 439/66 |
| 5,175,493 | 12/1992 | Langgard | 324/158 |
| 5,196,789 | 3/1993 | Golden et al. | 324/158 |
| 5,237,269 | 8/1993 | Aimi et al. | 324/158 |
| 5,247,250 | 9/1993 | Rios | 324/158 F |

FOREIGN PATENT DOCUMENTS

| | | |
|---|---|---|
| 524086 | 1/1977 | Japan ........................ 439/66 |
| H5-343142 | 12/1993 | Japan . |
| H5-343143 | 12/1993 | Japan . |
| H5-343144 | 12/1993 | Japan . |
| H5-343146 | 12/1993 | Japan . |

OTHER PUBLICATIONS

IBM Technical Disclosure Bulletin (Bry, et al.), vol. 22, No. 4, pp. 1476–1477, (Sep. 1979).
IBM Technical Disclosure Bulletin, vol. 29, No. 6, p. 2766, (Nov. 1986).
IBM Technical Disclosure Bulletin, vol. 31, No. 3, pp. 39–40, (Aug. 1988).

*Primary Examiner*—Neil Abrams
*Assistant Examiner*—Barry Matthew L. Standig
*Attorney, Agent, or Firm*—Ira D. Blecker; Aziz M. Ahsan

[57] ABSTRACT

The present invention relates generally to a new apparatus and method for use in chip, module, card, etc., burn-in and/or test or electrical interconnection. More particularly, the invention encompasses an apparatus that is used as a temporary media between a chip, module, card, etc., that needs to be tested and/or burned-in and a test or burn-in system. A method for such burn-in and/or test or electrical interconnection is also disclosed.

The invention also encompasses an apparatus and a method that can be used as a permanent media between two electrical devices, such as, for example, between a chip and a module or a card, etc., that is to be contained in and part of a system.

31 Claims, 4 Drawing Sheets

HIGH DENSITY ELECTRICAL INTERCONNECT APPARATUS AND METHOD

CROSS-REFERENCE TO RELATED PATENT APPLICATION

This patent application is a Continuation-In-Part patent application of U.S. patent application Ser. No. 08/207,768, entitled "High Density Electrical Interconnect Apparatus and Method", filed on Mar. 8, 1994.

FIELD OF THE INVENTION

The present invention relates generally to a new apparatus and method for use in electrical interconnect. More particularly, the invention encompasses an apparatus that is used as a temporary interconnect media between a chip, module, card, etc., that needs to be tested and/or burned-in and a test or burn-in system. A method for such burn-in and/or test or electrical interconnect is also disclosed. The inventive interconnect may also be used as a permanent interconnect between a chip, module, card, etc. and its connecting item or element.

BACKGROUND OF THE INVENTION

Semiconductor devices are becoming smaller and more dense with the evolution of new technology. However, increases in circuit density produce a corresponding increase in overall chip failure rates at a time when chip failure rates must decrease to remain competitive. Chip manufacturers are therefore challenged to improve the quality of their products by identifying and eliminating defects which produce defective chips known as fails. Whereas significant improvements are being made to eliminate systematic defects by reducing process variability. Process improvements alone are not sufficient to eliminate all the random defects which effect both yield and reliability. Historically, screening techniques have been employed to improve product failure rates to acceptable levels by culling out many of these random defects.

The most successful of these screen types is burn-in, which has also seen significant improvement in recent years. When static burn-in was first introduced, failure rate improvement factors of 2 were typical for bipolar and early MOSFET products. Dynamic burn-in involving the application of stimuli to chip input/output pads yielded a 5 to 20 times improvement. It is now known that the efficiency of burn-in is limited by fails which escape detection during the burn-in process. Some chips see incomplete or no burn-in and account for many of the early fails experienced during use.

In situ burn-in was developed to overcome this deficiency. During in situ burn-in, tests are performed to ensure that the chips are experiencing proper stress, and fails which have the potential to recover are identified. In situ burn-in has been shown to improve failure rates by a factor of 30 or more. For single-chip modules, the burn-in process usually involves the insertion of the fully packaged chip into a socket on a burn-in board. For multi-chip modules (MCM's) the process is generally not as straightforward; with mixed technologies on the same MCM, the situation becomes even more complex. CMOS chips used in a multi-chip package along with bipolar chips cannot use the in situ burn-in process necessary to achieve the reliability objectives.

For high density chips, the best and most efficient way to improve the reliability failure rates is through in situ burn-in of the single chip module. Chips are placed on substrates using a solder reflow chip joining process or wire bond process and then are capped, tested, burned-in and shipped to the customer.

The unpackaged chips or integrated circuits that have met the customer requirements are also referred in the industry as Known-Good-Die (KGD). Known-Good-Die are chips that have been stressed under extremes of voltage, temperature or clock speed and tested to accelerate the occurrence and identification of the defects that cannot be detected when the chip is first fabricated, but failure may occur after several hours/days/months of use. Known-Good-Die is especially required in the Multi-Chip-Module (MCM) arena where chips are typically not fully tested until mounted to a module with several other types of chips or other technologies, and therefore, a failure of such a chip could be very expensive if not fatal to the module.

Additionally, within the industry there is also a need to make reliable electrical interconnects to C-4's (Controlled Collapse Chip Connections), wire bond pads, solder ball grid array, solder column grid array, land grid array, to name a few, and therefore it is extremely important that these electrical interconnects be first burned-in before they reach the end user. This testing and burning-in is also becoming important as the electrical interconnect grids are being tighter or closer.

Reusable Chip Test Package, Bry et al, IBM Technical Disclosure Bulletin, Vol. 22, No. 4, Pages 1476–1477 (September 1979), discloses a test package which permits the mounting of an integrated circuit chip without the use of solder or other kind of bonding for testing prior to final encapsulation.

Dynamic Burn-In of Integrated Circuit Chips at the Wafer Level, IBM Technical Disclosure Bulletin, Vol. 29, No. 6, Page 2766 (November 1986), discloses a burn-in test at the wafer level wherein a wafer is attached to and removed from a printed circuit board by a radiant heat source.

Test and Repair of Direct Chip Attach Modules, IBM Technical Disclosure Bulletin, Vol. 31, No. 3, Pages 39–40 (August 1988), discloses a method for removing a chip from a module where the chip tests bad or the joint between a module pad and a chip connection is bad. In the disclosed method, the chip is destroyed in the removal process, and a new chip attached.

U.S. Pat. No. 4,161,346 (Cherian et al.) discloses a connecting element for surface to surface connectors. A connecting element having a symmetrical, sinuous shape provides a spring action after exertion. The connecting element has, as an integral part thereof, a shorting beam that provides a shorter electrical path and it also provides a springing means to hold the element in a housing.

U.S. Pat. No. 4,199,209 (Cherian et al.), discloses an electrical interconnecting device. A plurality of resilient connectors are embedded in an elastomeric material with opposing ends thereof being exposed on opposite surfaces of the elastomeric body to provide contact points between two printed circuit boards or the like.

U.S. Pat. No. 4,295,700, for Interconnectors, discloses holder members that firmly hold an elastic material that provides an electrical connection between contact terminals of printed circuit boards.

U.S. Pat. No. 4,764,122 (Sorel et al.), disclose a data bus connector. At least one elastic lamination, having projections, provides an electrical connection between two metallizations or pads.

U.S. Pat. No. 4,963,822, for Method of Testing Circuit Boards And The Like, discloses methods and apparatus for testing circuit boards and like components with test probes which are installed in an adapter serving as a means for connecting the contacts of the component to be tested with the conductors of a testing unit.

U.S. Pat. No. 4,975,079 for Connector Assembly for Chip Testing, discloses an electrical connector having contact members and urging means for making electrical contact with convex deformable contact areas on an electric device during a test.

U.S. Pat. No. 5,237,269, for Connections Between Circuit Chips And A Temporary Carrier For Use In Burn-In Tests, discloses a circuit chip to be tested which is attached to a temporary, sacrificial carrier to perform burn-in and test steps of a chip fabrication process. The attachment technique allows the circuit chip to be sheared off the ceramic substrate of the temporary carrier with no damage to the chip or the carrier such that the carrier may be reused. After burn-in, the joints are sheared off without causing damage to the chips or carrier. A high temperature hydrogen reflow process is then used to re-shape the solder balls to their original form. The chips are visually inspected for any physical damage prior to shipment.

The product of the present invention results in a tool or apparatus that provides an electrically reliable connection between the chip to be tested or the device under test (DUT) and the testing unit. Furthermore, the temporary joint that is formed is strong enough to hold the chip in position throughout the burn-in and/or test procedures, but it is compliant enough not to cause damage to either the chip or the testing unit. Furthermore, the present invention is very inexpensive compared to the prior known burn-in units, which require expensive complicated mechanical connectors or probes for forming less reliable pressure contacts.

PURPOSES AND SUMMARY OF THE INVENTION

The invention is a novel method and apparatus for providing an electrical Z-axis interconnect that is adaptable, reliable and provides high compliance.

Therefore, one purpose of this invention is to provide an apparatus and a method for chip or module burn-in and/or test.

Another purpose of this invention is to provide for constant force, high quality electrical contact on product with large planarity limits.

Still another purpose of this invention is to have a simple design which allows for a variety of cost effective manufacturing techniques.

Yet another purpose of this invention is to provide a high force per unit area concentration at tip of the electrical probe so as to break any oxide that might be present.

Yet another purpose of this invention is to provide a high force per unit area concentration at tip of the electrical probe with low force applied to contact.

Still yet another purpose of the invention is to have a probe assembly that can be reworked and/or repaired easily.

Yet another purpose of this invention is to provide a low profile, high compliance interconnect.

Still another purpose of this invention is to provide a temporary or permanent interconnect for a chip and/or a module.

Therefore, in one aspect this invention comprises an interconnect interposer comprising an electrically insulative body, said electrically insulative body having at least one electrically conductive interconnect probe, wherein said interconnect probe has a center portion having a first end and a second end, wherein at least said first end and/or said second end has a pre-formed deflective tip.

In another aspect this invention comprises an interconnect interposer comprising an electrically insulative body having at least one hole to accommodate at least one electrically conductive interconnect probe, wherein said interconnect probe has a center portion having a first end and a second end, wherein at least said first end and/or said second end has a deflective tip.

In yet another aspect this invention comprises a method for electrical interconnect comprising the steps of:

(a) placing at least a portion of an interconnect interposer over an electronic device, such that at least a portion of said interconnect interposer makes electrical contact with at least a portion of said electronic device, (b) placing at least a portion of an element to be electrically interconnected over at least a portion of said interconnect interposer, such that at least a portion of said element makes electrical contact with at least a portion of said electronic device through said interconnect interposer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Systems for both electrical test and/or burn-in and/or temporary or permanent interconnect of electronic circuits continue to grow in importance as contact densities increase. Current trends on chips, modules and cards/boards are pushing the limits of available technology.

The invention described here provides a highly variable tool that can be adapted to a large variety of requirements, such as, but not limited to, size, compliance, force, material selection, configuration, etc..

Some of the industrial applications for which this system can be readily used, includes, but not limited to, wafer testing, chip (both C-4 and wire bond) testing, area array module testing, card/board interconnect and other types of testing. Testing as used herein includes both test and associated stress/burn-in.

This interconnect can also be used as a permanent interconnect device for various electrical interconnect applications.

The basic feature of the invention is the incorporation of a pre-formed deflective section of thin, resilient conductive material, such as, beryllium copper, at the contact end of the probe. This pre-formed deflective section can be a full circle, half circle, portion of an arc, or other parabolic, hyperbolic or curved surface providing a "spring" effect to the probe body. By selecting the appropriate design (curved section and dimensions) for the material chosen, a wide range of compliance/force can be achieved.

This pre-formed curved or deflective section can be on one or both sides of the probe body. If on both sides, probes are arranged in a housing such that appropriately spaced contacts extend on both sides and the unit can be used as an interposer. If on one side, probes are soldered to or inserted into a base substrate with the probe deflective ends protruding.

Figure 1:
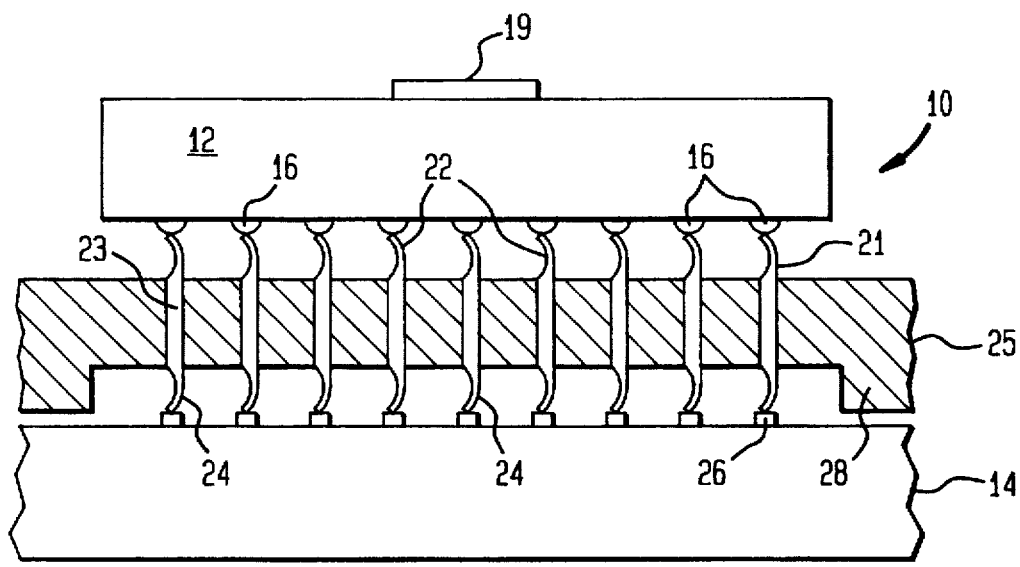
FIG. 1, illustrates a preferred embodiment of this invention.

The preferred embodiment of the invention is illustrated in FIG. 1, where the burn-in and/or test apparatus 10, has a burn-in and/or test interconnect interposer 25, acting as a temporary interconnect media, is sandwiched between a chip or module to be burned-in 12, and a burn-in and/or test system or interface 14.

The chip or module 12, typically has electrical contacts 16, such as, solder balls or solder columns or C-4s (Controlled Collapse Chip Connection) or pads, to name a few, on one side. The burn-in and/or test system or interface 14, on one side typically has electrical contacts 26, such as, solder balls or solder columns or C-4s or pads, to name a few, and on the opposite side it has pins or wiring that is typically connected to the apparatus that monitors and/or provides the burn-in and/or test to the chip or module 12.

The inventive burn-in and/or test interconnect interposer 25, typically has a plurality of burn-in and/or test probes 21, having a stem or spine or trunk or body 23. The body 23, typically has an upper or first pre-formed deflective end 22, and a lower or second pre-formed deflective end 24. When used for chip or module burn-in and/or test the burn-in and/or test interconnect interposer 25, is placed between the chip or module 12, that has to be tested or burned-in and the burn-in and/or test system 14, that will provide the necessary burn-in and/or test, such that the first pre-formed deflective end 22, makes a wiping contact with the solder balls or pads 16, and the second pre-formed deflective end 24, makes a wiping contact with the solder balls or pads 26. The tips of the deflective ends 22 and 24, could be sharp so as to penetrate or puncture at least a portion of the solder columns 16 and/or 26, or they could be blunt so as to only provide a wiping action. In order to insure a good electrical contact between the chip or module 12, and the burn-in and/or test system 14, urging means 19, are typically used. Urging means 19, could be any means that provide pressure to the surface of the chip or module 12, so that a good wipe and electrical contact is obtained between the two pre-formed deflective ends 22 and 24, and the corresponding pads 16 and 26, respectively.

The burn-in and/or test interconnect interposer 25, could also have means 28, either on one or both sides to limit the contact between the burn-in and/or test interconnect interposer 25, and/or the chip 12, and/or the burn-in and/or test interface or system 14. The means 28, is typically a burn-in and/or test module stop 28.

Figures 2A, 2B, 2C:
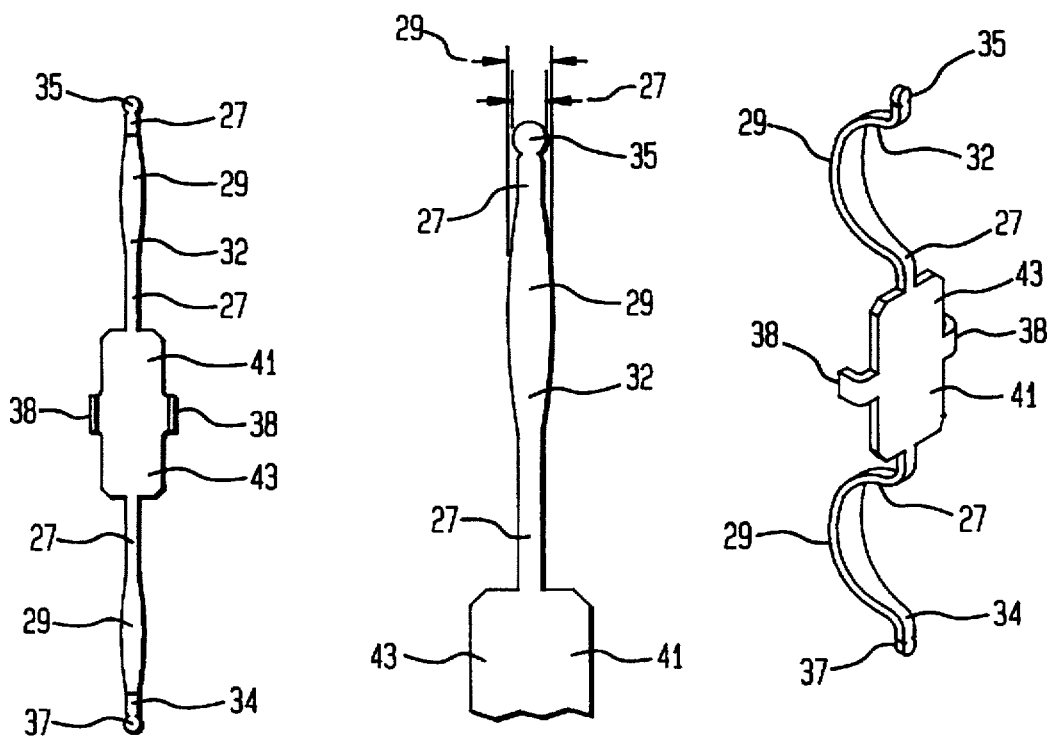
FIG. 2A, illustrates a front view of a preferred embodiment of this invention.
FIG. 2B, is an enlarged view of a section of the preferred embodiment of the invention as illustrated in FIG. 2A.
FIG. 2C, is a perspective view of the preferred embodiment of FIG. 2A.

FIGS. 2A, 2B and 2C, illustrate another preferred embodiment of the invention, showing a burn-in and/or test probe 41. The burn-in and/or test probe 41, typically has a stem or spine or trunk or body 43, which may float or move freely within the hole or opening 63, as more clearly seen in FIGS. 5 and 6 or it may be fixed. The body 43, typically has an upper or first deflective end 32, and a lower or second deflective end 34.

The probe 41, has stops or retainer tabs 38, which are bent about 90 degrees to the rigid body 43. The preformed deflective ends 32 and 34, are also at about 90 degrees or are perpendicular to the rigid body 43. It should be noticed that the semi-circular type ends 32 and 34, vary in cross-sectional area starting at the one end and terminating at the rigid body 43. As more clearly seen in FIG. 2B, the section 29, is wider than the narrow section 27, of the semicircular deflective end 32 or 34. With this feature the probe deflective end geometry can be optimized for performance.

The tips 35 and 37, could be sharp so as to penetrate or puncture at least a portion of the pads 16 and/or 26, or they could be blunt so as to only provide a wiping action.

In a typical application the deflective ends 32 and 34, are semicircular so that when the urging means 19, places pressure on these semi-circular type deflective ends 32 and 34, it does so along the center line of the semi-circle causing these deflective ends 32 and 34, to deflect and form an almost semi-elliptical type shape. However, centerline force prevents torque induced rotations.

Figure 3:
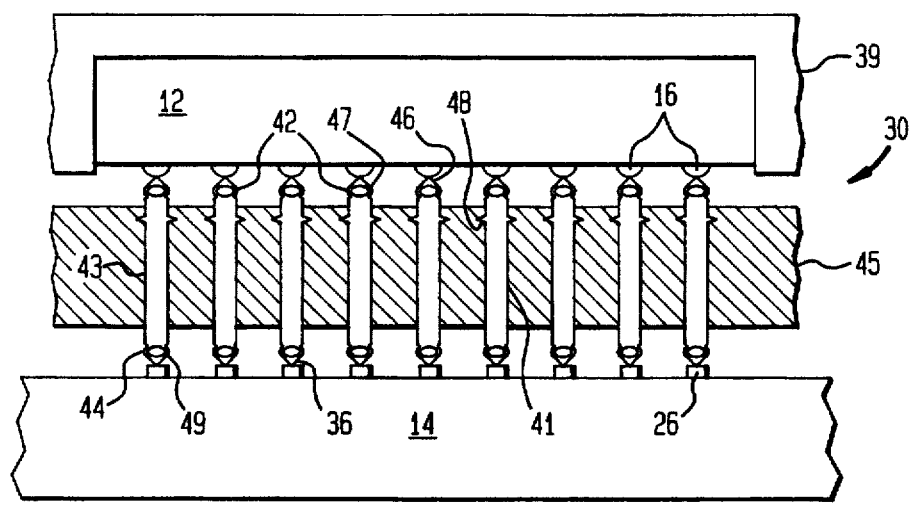
FIG. 3, illustrates yet another preferred embodiment of this invention.

Still another preferred embodiment of the invention is illustrated in FIG. 3, where a burn-in and/or test apparatus 30, is shown. The burn-in and/or test apparatus 30, is similar to the burn-in and/or test apparatus 10, except that the inventive burn-in and/or test interposer 45, is somewhat different. The burn-in and/or test interposer 45, has at least one burn-in and/or test probe 41, which is shown in more detail in FIG. 4A. The burn-in and/or test probe 41, typically has a stem or spine or trunk or body 43, which typically has a stop or retainer tab 48, to prevent the body 43, from freely floating or moving within the burn-in and/or test interposer 45. The body 43, typically has an upper or first pre-formed deflective end 42, and a lower or second pre-formed deflective end 44. When used for chip or module burn-in and/or test the burn-in and/or test interposer 45, is placed between the chip or module 12, that has to be tested or burned-in and the burn-in and/or test interface or system 14, that will provide the necessary burn-in and/or test, such that the first pre-formed deflective end 42, makes an electrical contact with the solder ball 16, and the second pre-formed deflective end 44, makes a wiping electrical contact with the pad 26. In order to insure a good electrical contact between the chip or module 12, and the burn-in and/or test interface or module 14, urging means 39, are typically used. The urging means 39, typically provide pressure to the entire surface of the chip or module 12, during the burn-in and/or test process.

Figure 4A:
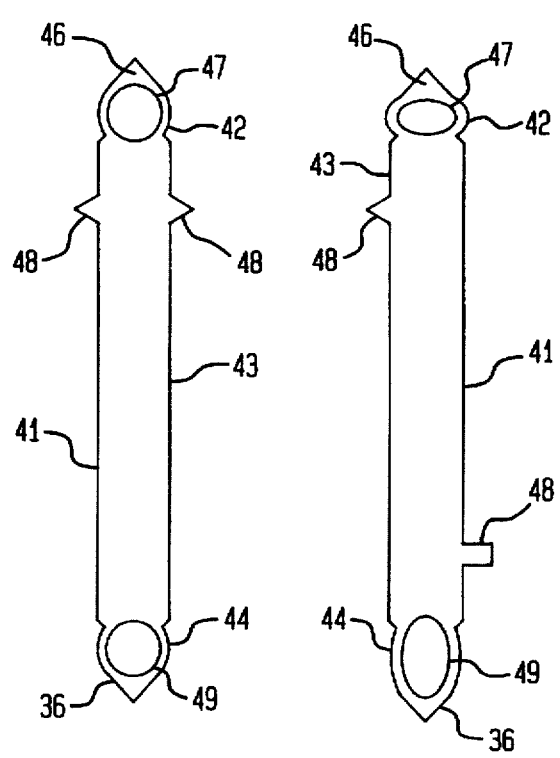
FIG. 4A, is a more detailed embodiments of the interconnect probe shown in FIG. 3.
Figure 4B:
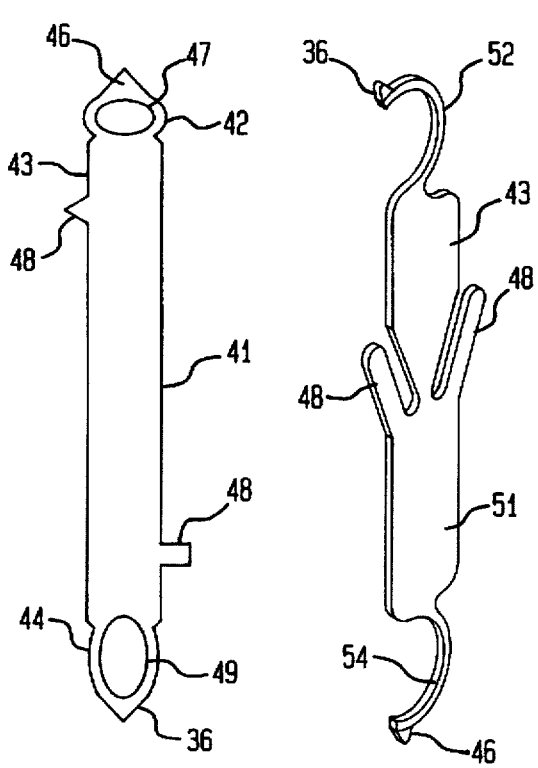
FIG. 4B, is an embodiment of another interconnect probe of this invention.

FIGS. 4A and 4B, show a more detailed view of the burn-in and/or test probe 41. The deflective ends 42 and 44, typically have a hole or opening 47 and 49, respectively. Similarly, the ends 42 and 44, also typically have tips 46 and 36, respectively. The tips 46 and 36, could be sharp so as to penetrate or puncture at least a portion of the pads 16 and/or 26, or they could be blunt so as to only provide a wiping action. The hole or opening 47 and/or 49, could be circular or elliptical or similar other shape, so that a corresponding shape for the end 42 and/or 44, is obtained. In a typical application the hole 47 or 49, is circular so that a circular end 42 or 44, is obtained and when the urging means 39, places pressure on these circular type ends 42 or 44, these end deflect and form an almost semi-elliptical type shape.

Figure 4C:
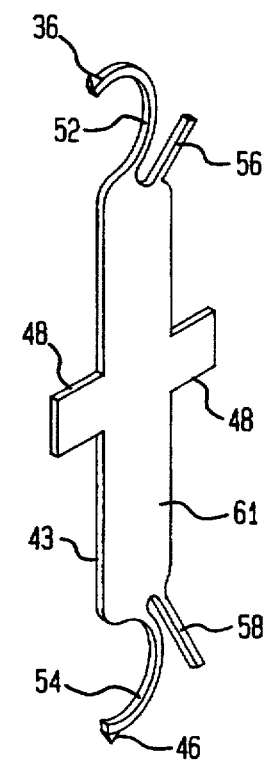
FIG. 4C, is yet another embodiment of a interconnect probe of this invention.

FIG. 4C, illustrates another embodiment of a burn-in and/or test probe 51. Pre-formed deflective ends 52 and 54, typically are in a shape of a hook for flexibility and compliance. The tips 36 and 46, could be sharp so as to penetrate or puncture at least a portion of the pads 16 and/or 26, or they could be blunt so as to only provide a wiping action. The shape of the pre-formed deflective ends 52 and 54, could be of any shape, as long as the burn-in and/or test probe 51, provides an electrical connection between the chip or module 12, and the burn-in and/or test interface or module 14. In a typical application the ends 52 or 54, are semi-circular so that when the urging means 39, places pressure on these semi-circular type ends 52 or 54, these end deflect and form an almost elliptical type shape.

Figure 4D:
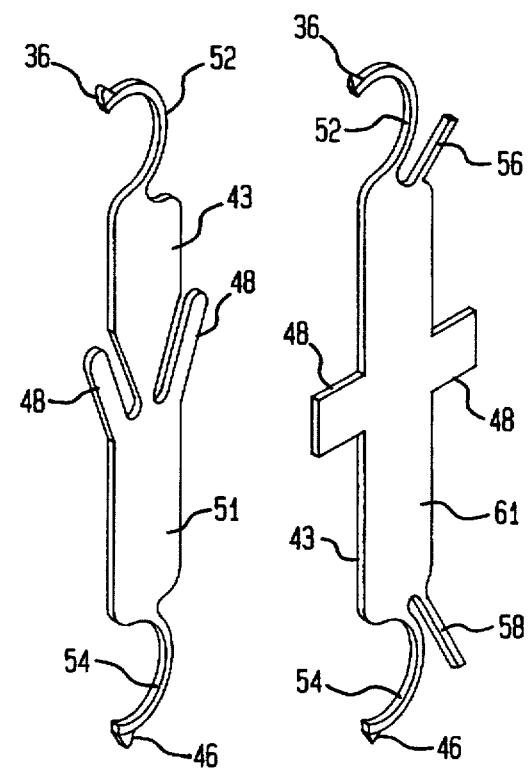
FIG. 4D, is still yet another embodiment of a interconnect probe of this invention.

FIG. 4D, illustrates yet another embodiment of a burn-in and/or test probe 61. The burn-in and/or test probe 61, is similar to the burn-in and/or test probe 51, except that the stop or retainer tabs 48, are different, and the burn-in and/or test probe 61, has at least one stop 56, to stop or contain the complete deflection of the first or upper deflective end 52. Similarly, the burn-in and/or test probe 61, could also have at least one stop 58, to stop or contain the complete deflection of the second or lower deflective end 54.

Figure 5:
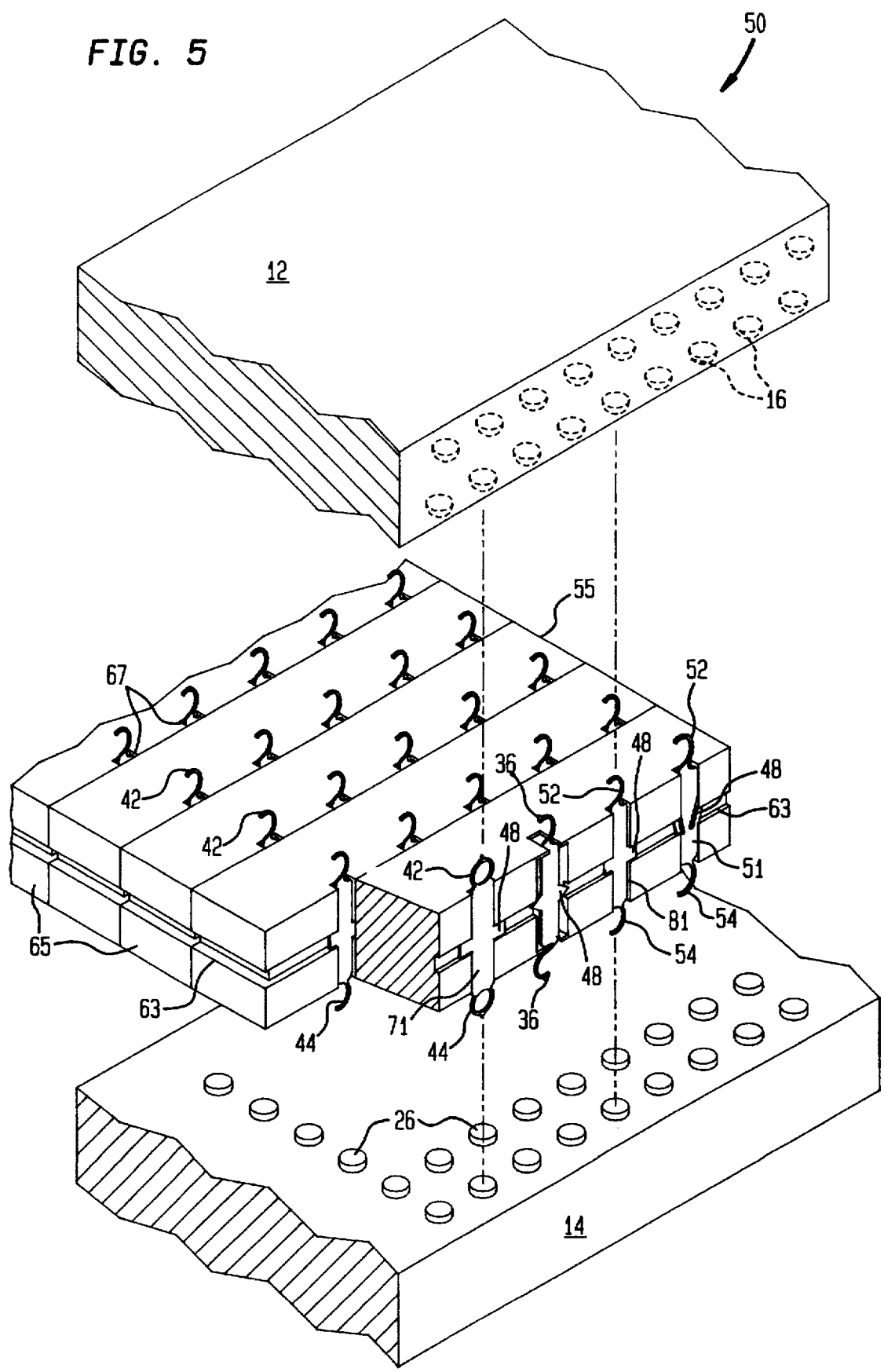
FIG. 5, is a perspective view of various embodiments of this invention.

FIG. 5, is a perspective view of still another embodiment of the invention. The burn-in and/or test apparatus 50, has a burn-in and/or test interposer 55. The interposer 55, has at least one channel or trench 63, to accommodate the stop or retainer tabs 48. Also, shown in FIG. 5, are additional different embodiments of burn-in and/or test probes 71 and 81. The burn-in and/or test probe 71, is very similar to the burn-in and/or test probe 41, except it has stop or retainer tabs 48, that are retained in the channel or trench 63. Similarly, the burn-in and/or test probe 81, is very similar to the burn-in and/or test probe 51, except for the stop or retainer tabs 48, that are accommodated in the channel or trench 63. It should also be noted that the retainer tabs 48, of the burn-in and/or test probe 51, expand inside the channel or trench 63, as shown in FIG. 5.

It is preferred that the burn-in and/or test probes are assembled inside the burn-in and/or test interposer strip 65, and then the individual burn-in and/or test interposer strips 65, are then assembled to form the burn-in and/or test interposer 55. However, for some embodiments the burn-in and/or test interposer 55, could be provided with at least one hole or opening 67, through which a burn-in and/or test probe could be fed through and retained inside the burn-in and/or test interposer 55.

Figure 6:
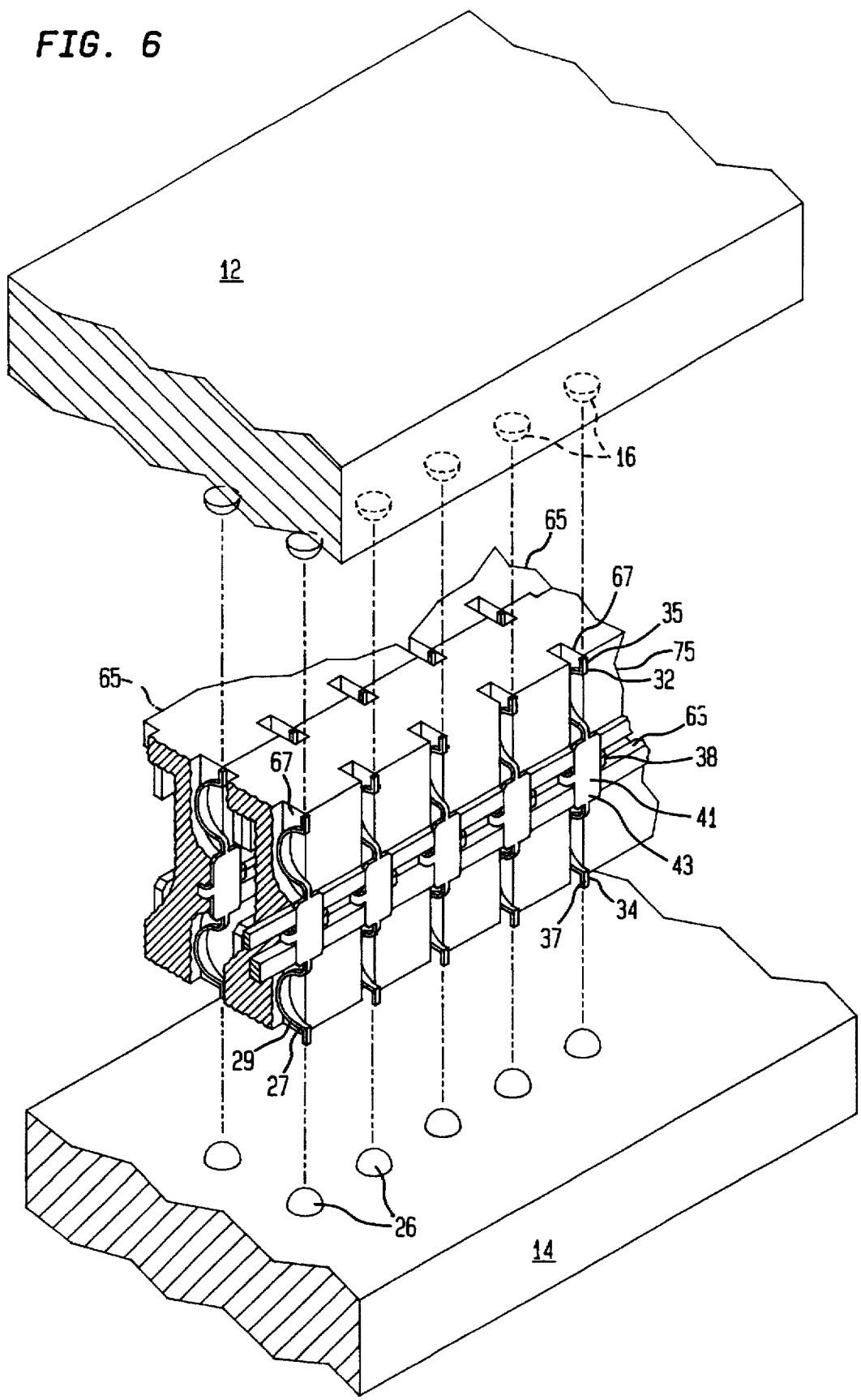
FIG. 6, is another perspective view of yet other embodiments of this invention.

FIG. 6, is a perspective view of yet another embodiment of the invention. The burn-in and/or test interposer 75, is very similar to the interposer 55, except that it has burn-in or test probes 41, as illustrated in FIGS. 2A, 2B and 2C. The interposer 75, has at least one channel or trench 63, to accommodate the stop or retainer tabs 38. The burn-in and/or test probe 41, is very similar to the burn-in and/or test probe 71, except it has stop or retainer tabs 38, that are retained in a perpendicular or at about a 90 degrees angle inside the channel or trench 63. It should also be noted that the retainer tabs 38, of the burn-in and/or test probe 41, expand inside the channel or trench 63, as shown in FIG. 6.

It is preferred that the burn-in and/or test probes are assembled inside the burn-in and/or test interposer strip 65, and then the individual burn-in and/or test interposer strips 65, are then assembled to form the burn-in and/or test interposer 75. However, for some embodiments the burn-in and/or test interposer 75, could be provided with at least one hole or opening 67, through which a burn-in and/or test probe could be fed through and retained inside the burn-in and/or test interposer 75.

It should be understood that the channel or trench 63, should be designed in such a manner to be wide enough to permit the burn-in and/or test probe 41, to float in the vertical direction so that the total deflection (compliance) is shared among the two deflective tips. This permits compliance to be the sum of the two ends 32 and 34.

The inventive burn-in and/or test probes mounted in the burn-in and/or test interconnect could be mounted in a housing or on a substrate or could be used directly on test boards, or incorporated into sockets or be used as part of a connector system.

The manufacture of these inventive burn-in and/or test probes can be accomplished either through a masking and an etching processes or via stamping or coining operations. The burn-in and/or test probes once manufactured can then easily be placed into a carrier or a burn-in and/or test interconnect strip that will result in a burn-in and/or test interconnect.

The burn-in and/or test probe could be made from any electrically conductive material such as, BeCu, BeNi, Cu or Cu alloys, Fe or Fe alloys and any other electrically conductive material, such as an electrically conductive polymer or elastomer, to name a few.

Similarly, the material for the burn-in and/or test interconnect and/or individual interconnect strips must be some electrically insulative type material and could be selected from any electrically insulative material, such as, but not limited to, plastics, ceramics, polymers, epoxies, natural and man made fabrics, to name a few.

The burn-in and/or test interconnect is preferably formed by molding techniques, such as, forming individual strips and placing a burn-in and/or test probe inside said strip and then reflowing the material so as to form the burn-in and/or test interconnect.

The individual interconnect probes are assembled into an array for providing a temporary or permanent interconnect.

The attachment technique of the present invention results in an electrically reliable joint which is strong enough to hold the chip in position on a carrier throughout the burn-in and/or test procedures, but which is compliant enough not to cause damage to either the chip or the burn-in or testing module or carrier. The attachment technique of the present invention is very inexpensive compared to the prior known techniques which required expensive and complicated mechanical connectors or probes for forming less reliable pressure contacts.

EXAMPLES

The following examples are intended to further illustrate the invention and are not intended to limit the scope of the invention in any manner.

Example 1

A burn-in and/or test interconnect as illustrated in FIG. 1, was made which had spacings between burn-in and/or test probes as fine as 0.224 mm (0.0088 in). This type of spacing is typical for chip C-4 applications. A compliance of 0.038 mm (0.0015 in) was obtained for the C-4 chips, which was per side, for the double sided burn-in and/or test probes, and a 0.150 mm pitch for peripheral chip pads was obtained.

Example 2

A burn-in and/or test interconnect as illustrated in FIG. 1, was made which had spacings between burn-in and/or test probes as large as 1.270 mm (0.050 in). This type of spacing is typical for area array module applications. A compliance of 0.254 mm (0.010 in) was obtained for the modules, which was per side, for the double sided burn-in and/or test probes.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An interconnect interposer comprising an electrically insulative body, said electrically insulative body having at least one electrically conductive interconnect probe providing an electrically conductive path, wherein said at least one electrically conductive interconnect probe has a rigid planar center portion, two retainer tabs connected to said rigid planar center portion to limit the floating of said at least one electrically conductive interconnect probe within said electrically insulative body, a first end and a second end, wherein at least said first end at least one of said first or second end said second end has a pre-formed deflective section, wherein a portion of said pre-formed deflective section has a protruding tip, wherein said pre-formed deflective section is narrower in cross-sectional area than said rigid center portion, wherein said rigid center portion is non-deflective, and wherein said electrically conductive path is from said first end through said non-deflective rigid center portion to said second end.

2. The interconnect interposer of claim 1, wherein the material for said electrically insulative body is selected from a group consisting of plastics, ceramics, polymers, epoxies, natural and man made fabrics.

3. The interconnect interposer of claim 1, wherein the material for said electrically conductive interconnect probe is selected from a group consisting of BeCu, BeNi, Cu, Cu alloys, Fe, Fe alloys, electrically conductive polymer, elastomer and noble metal alloys.

4. The interconnect interposer of claim 1, wherein the geometry of said pre-formed deflective tip end is selected from a group consisting of circular, semi-circular, elliptical, rectangular, triangular and polygonal.

5. The interconnect interposer of claim 1, wherein said protruding tip of said pre-formed deflective tip end is sharp.

6. The interconnect interposer of claim 1, wherein said protruding tip of said pre-formed deflective tip end is blunt.

7. The interconnect interposer of claim 1, wherein said first end is a mirror image of said second end.

8. The interconnect interposer of claim 1, wherein said first end is not a mirror image of said second end.

9. The interconnect interposer of claim 1, wherein said at least one electrically conductive interconnect probe provides an electrical connection between two electrical components to be electrically interconnected.

10. The interconnect interposer of claim 1, wherein there is at least one stop on said deflective section to prevent an end of said at least one electrically conductive interconnect probe from completely deflecting.

11. The interconnect interposer of claim 1, wherein said retainer tabs are bent about 90 degrees to the rigid planar center portion.

12. The interconnect interposer of claim 1, wherein said pre-formed deflective section has a varying cross-sectional area.

13. The interconnect interposer of claim 1, wherein said at least one electrically conductive interconnect probe is made by a process selected from a group consisting of stamping, forming and etching.

14. The interconnect interposer of claim 1, wherein a force is applied to said at least one electrically conductive interconnect probe from the top and bottom along said at least one electrically conductive interconnect probe's centerline, such that compliance at each end is shared without generating a torque movement.

15. The interconnect interposer of claim 5, wherein a portion of said protruding tip penetrates a portion of an electrical contact.

16. The interconnect interposer of claim 1, further comprising at least a second electrically conductive interconnect probe and wherein the center to center spacing between each of said electrically conductive interconnect probes is between about 0.10 and about 2.00 mm.

17. An interconnect interposer comprising an electrically insulative body having at least one hole to accommodate at least one electrically conductive interconnect probe, wherein said at least one electrically conductive interconnect probe has a rigid planar center portion having a first end and a second end and further having two retainer tabs connected to said rigid planar center portion to limit the floating of said at least one electrically conductive interconnect probe within said electrically insulative body, wherein at least said first end at least one of said first or second end said second end has a pre-formed deflective section, wherein a portion of said pre-formed deflective section is narrower in cross-sectional area than said rigid planar center portion, and wherein said rigid planar center portion is non-deflective.

18. The interconnect interposer of claim 17, wherein the material for said electrically insulative body is selected from a group consisting of plastics, ceramics, polymers, epoxies, natural and man made fabrics.

19. The interconnect interposer of claim 17, wherein the material for said at least one electrically conductive interconnect probe is selected from a group consisting of BeCu, BeNi, Cu, Cu alloys, Fe, Fe alloys, electrically conductive polymer, elastomer and noble metal alloys.

20. The interconnect interposer of claim 17, wherein a distal portion of said deflective section is sharp.

21. The interconnect interposer of claim 17, wherein a distal portion of said deflective section is blunt.

22. The interconnect interposer of claim 17, wherein said first end is a mirror image of said second end.

23. The interconnect interposer of claim 17, wherein said at least one electrically conductive interconnect probe provides an electrical connection between a chip and a test substrate.

24. The interconnect interposer of claim 17, wherein there is at least one stop on said deflective section to prevent an end of said at least one electrically conductive interconnect probe from completely deflecting.

25. A method for electrical interconnect comprising the steps of:

(a) placing at least a portion of an interconnect interposer over an electronic module, such that at least a portion of said interconnect interposer makes electrical contact with at least a portion of said electronic module, (b) placing at least a portion of an element to be electrically interconnected over at least a portion of said interconnect interposer, such that at least a portion of said element makes electrical contact with at least a portion of said electronic module through said interconnect interposer, wherein said interconnect interposer has at least one probe that provides said electrical connection between said element and said electronic module, said at least one probe has a rigid planar center portion having a first end and a second end and further having two retainer tabs connected to said rigid planar center portion to limit the floating of said at least one probe within said interconnect interposer, wherein at least said first end at least one of said first or second end said second end has a pre-formed deflective tip, wherein a portion of said pre-formed deflective tip is narrower in cross-sectional area than said rigid planar center portion, and wherein said rigid planar center portion is non-deflective.

26. The method of claim 25, wherein said element to be electrically interconnected is a chip or a module.

27. The method of claim 25, wherein at least one end of said at least one probe has at least one stop on said pre-formed deflective tip to prevent the complete deflection of said at least one pre-formed deflective tip.

28. The interconnect interposer of claim 1, wherein there is at least one stop on a peripheral surface of said insulative body to prevent an end of said at least one electrically conductive interconnect probe from completely deflecting.

29. The interconnect interposer of claim 17, wherein there is at least one stop on a peripheral surface of said insulative body to prevent an end of said at least one electrically conductive interconnect probe from completely deflecting.

30. The interconnect interposer of claim 4 wherein the geometry of said pre-formed deflective tip is circular.

31. The interconnect interposer of claim 4 wherein the geometry of said pre-formed deflective tip is semi-circular.

* * * * *